(12) United States Patent
Liu et al.

(10) Patent No.: US 12,237,881 B2
(45) Date of Patent: Feb. 25, 2025

(54) MULTI-RADIO FILTERING FRONT-END CIRCUITRY FOR TRANSCEIVER SYSTEMS

(71) Applicant: Apple Inc., Cupertino, CA (US)

(72) Inventors: Hsin-Yuo Liu, Fremont, CA (US); Peter M. Agboh, Burlingame, CA (US); Mohit Narang, Cupertino, CA (US); Indranil S. Sen, Cupertino, CA (US); Nicholas M. McDonnell, San Jose, CA (US); Chia Yiaw Chong, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/939,725

(22) Filed: Sep. 7, 2022

(65) Prior Publication Data

US 2022/0416849 A1 Dec. 29, 2022

Related U.S. Application Data

(60) Continuation of application No. 17/228,454, filed on Apr. 12, 2021, now Pat. No. 11,502,730, which is a
(Continued)

(51) Int. Cl.
*H04B 7/0413* (2017.01)
*H03F 3/24* (2006.01)
(Continued)

(52) U.S. Cl.
CPC .......... *H04B 7/0413* (2013.01); *H03F 3/245* (2013.01); *H03F 3/68* (2013.01); *H03H 9/02007* (2013.01);
(Continued)

(58) Field of Classification Search
CPC ...... H03H 9/171; H04B 1/001; H04B 1/0017; H04B 1/38; H04B 1/40; H04B 1/401; H04B 1/405; H04B 1/44; H04B 1/50; H04B 1/66; H04L 5/0023; H04L 5/0028; H04L 5/22; H04W 4/80; H04W 84/12; H04W 88/06
USPC ........ 375/219, 220, 222, 260, 267; 370/278, 370/280, 321, 337, 347; 455/78, 88, 455/553.1
See application file for complete search history.

(56) References Cited

U.S. PATENT DOCUMENTS 6,985,755 B2  1/2006 Cadieux et al.
7,257,380 B2  8/2007 Darabi et al.
(Continued)

FOREIGN PATENT DOCUMENTS

CN  102830634 A  12/2012
CN  103236868 A  8/2013
(Continued)

*Primary Examiner* — Young T. Tse
(74) *Attorney, Agent, or Firm* — Fletcher Yoder, P.C.

(57) ABSTRACT

Devices and systems useful in concurrently receiving and transmitting Wi-Fi signals and Bluetooth signals in the same frequency band are provided. By way of example, an electronic device includes a transceiver configured to transmit data and to receive data over channels of a first wireless network and a second wireless network concurrently. The transceiver includes a plurality of filters configured to allow the transceiver to transmit the data and to receive the data in the same frequency band by reducing interference between signals of the first wireless network and the second wireless network.

20 Claims, 8 Drawing Sheets

Related U.S. Application Data continuation of application No. 16/874,349, filed on May 14, 2020, now Pat. No. 10,979,106, which is a continuation of application No. 16/267,104, filed on Feb. 4, 2019, now Pat. No. 10,720,971, which is a division of application No. 15/189,874, filed on Jun. 22, 2016, now Pat. No. 10,200,183.

(51) Int. Cl.

| | |
|---|---|
| H03F 3/68 | (2006.01) |
| H03H 9/02 | (2006.01) |
| H03H 9/17 | (2006.01) |
| H03H 9/64 | (2006.01) |
| H04B 1/00 | (2006.01) |
| H04B 1/38 | (2015.01) |
| H04B 1/40 | (2015.01) |
| H04L 5/00 | (2006.01) |
| H04L 5/14 | (2006.01) |
| H04W 4/80 | (2018.01) |
| H04W 84/12 | (2009.01) |
| H04W 88/06 | (2009.01) |

(52) U.S. Cl.
CPC ............. *H03H 9/171* (2013.01); *H03H 9/64* (2013.01); *H04B 1/001* (2013.01); *H04B 1/38* (2013.01); *H04B 1/40* (2013.01); *H04L 5/0023* (2013.01); *H04L 5/0028* (2013.01); *H04L 5/0066* (2013.01); *H04L 5/1461* (2013.01); *H04L 5/1469* (2013.01); *H04W 4/80* (2018.02); *H03F 2200/111* (2013.01); *H03F 2200/451* (2013.01); *H04W 84/12* (2013.01); *H04W 88/06* (2013.01)

(56) References Cited

U.S. PATENT DOCUMENTS

| | | | |
|---|---|---|---|
| 7,403,774 B2 | 7/2008 | Chandra et al. | |
| 7,636,554 B2* | 12/2009 | Sugar .................. | H04B 1/406 |
| | | | 455/272 |
| 8,615,270 B2 | 12/2013 | Ibrahim et al. | |
| 9,207,748 B2 | 12/2015 | Paljug | |
| 9,907,015 B2 | 2/2018 | Hegde et al. | |
| 9,923,581 B2 | 3/2018 | Emmanuel et al. | |
| 10,164,722 B1* | 12/2018 | Napoles ................ | H04B 1/406 |
| 2004/0162023 A1 | 8/2004 | Cho | |
| 2004/0259589 A1 | 12/2004 | Bahl et al. | |
| 2005/0208900 A1 | 9/2005 | Karacaoglu | |
| 2005/0243954 A1 | 11/2005 | Li | |
| 2006/0128308 A1 | 6/2006 | Michael et al. | |
| 2007/0202807 A1 | 8/2007 | Kim | |
| 2008/0045152 A1 | 2/2008 | Boes | |
| 2008/0045162 A1 | 2/2008 | Rofougaran et al. | |
| 2010/0040178 A1* | 2/2010 | Sutton .................... | H04K 3/228 |
| | | | 375/345 |
| 2010/0316027 A1 | 12/2010 | Rick et al. | |
| 2011/0116490 A1* | 5/2011 | Wilhelmsson ........ | H04W 16/14 |
| | | | 370/343 |
| 2011/0171922 A1 | 7/2011 | Kim et al. | |
| 2011/0175789 A1* | 7/2011 | Lee ........................ | H01Q 1/243 |
| | | | 333/17.1 |
| 2011/0267966 A1 | 11/2011 | Gao et al. | |
| 2012/0092714 A1 | 4/2012 | Suzuki | |
| 2012/0202561 A1 | 8/2012 | Robinett | |
| 2013/0070749 A1 | 3/2013 | Kim | |
| 2013/0148636 A1 | 6/2013 | Lum et al. | |
| 2013/0225107 A1* | 8/2013 | Lane .................... | H04B 1/0458 |
| | | | 455/234.1 |
| 2013/0259016 A1 | 10/2013 | Xhafa et al. | |
| 2013/0265945 A1 | 10/2013 | He et al. | |
| 2014/0016498 A1 | 1/2014 | Sharma | |
| 2014/0056288 A1 | 2/2014 | Wyper et al. | |
| 2014/0162023 A1 | 6/2014 | Greer, Jr. et al. | |
| 2014/0185498 A1* | 7/2014 | Schwent ............... | H04B 1/0057 |
| | | | 370/297 |
| 2014/0269650 A1 | 9/2014 | Sahota | |
| 2014/0293912 A1 | 10/2014 | Chao et al. | |
| 2014/0349594 A1 | 11/2014 | Hoshihara et al. | |
| 2015/0031288 A1 | 1/2015 | Tubbesing et al. | |
| 2015/0133185 A1 | 5/2015 | Chen et al. | |
| 2015/0257022 A1* | 9/2015 | Kohlmann ........... | H04B 1/3805 |
| | | | 455/550.1 |
| 2015/0341932 A1* | 11/2015 | Amini ................ | H04W 52/0209 |
| | | | 370/336 |
| 2015/0365946 A1* | 12/2015 | Luong ................... | H04L 1/0003 |
| | | | 370/329 |
| 2016/0157193 A1 | 6/2016 | Qi et al. | |
| 2016/0227354 A1 | 8/2016 | Zhao et al. | |
| 2016/0352366 A1* | 12/2016 | Lee ....................... | H04B 1/0064 |
| 2016/0381706 A1 | 12/2016 | Huang et al. | |
| 2017/0188363 A1 | 6/2017 | Ellinikos ............. | H04W 72/542 |

FOREIGN PATENT DOCUMENTS

| | | | |
|---|---|---|---|
| CN | 105376040 A | 3/2016 | |
| TW | 201539999 A * | 10/2015 | ........... H04B 1/0475 |
| WO | 2013063922 A1 | 5/2013 | |

\* cited by examiner

MULTI-RADIO FILTERING FRONT-END CIRCUITRY FOR TRANSCEIVER SYSTEMS

CROSS REFERENCE TO RELATED APPLICATIONS

This application is a continuation of U.S. patent application Ser. No. 17/228,454, filed Apr. 12, 2021, entitled "MULTI-RADIO FILTERING FRONT-END CIRCUITRY FOR TRANSCEIVER SYSTEMS," which is a continuation of U.S. patent application Ser. No. 16/874,349, filed May 14, 2020, entitled "MULTI-RADIO FILTERING FRONT-END CIRCUITRY FOR TRANSCEIVER SYSTEMS," which is a continuation of U.S. patent application Ser. No. 16/267,104, filed Feb. 4, 2019 and entitled "MULTI-RADIO FILTERING FRONT-END CIRCUITRY FOR TRANSCEIVER SYSTEMS," which is a divisional of U.S. patent application Ser. No. 15/189,874, filed Jun. 22, 2016 and entitled "MULTI-RADIO FILTERING FRONT-END CIRCUITRY FOR TRANSCEIVER SYSTEMS," each of which is incorporated herein by reference in its entirety for all purposes.

BACKGROUND

The present disclosure relates generally to transceivers of wireless electronic devices and, more particularly, to multi-radio filtering front-end circuitry for the transceivers of the wireless electronic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers, or when coupled together as part of a single unit, transceivers, are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. Certain types of transceivers, known as wireless transceivers, may be used to generate and receive wireless signals to be transmitted and/or received by way of an antenna coupled to the transceiver. Specifically, the wireless transceiver is generally used to wirelessly communicate data over a network channel or other medium (e.g., air) to and from one or more external wireless devices.

For example, these transceivers may be included in various mobile and in-home wireless electronic devices, and particularly mobile and in-home wireless electronic devices that may support wireless applications such as, for example, Bluetooth, Wireless Fidelity (Wi-Fi), ZigBee, Long Term Evolution (LTE) cellular, and so forth. Thus, the support of the aforementioned wireless applications may depend on the wireless electronic devices achieving excellent signal reception quality. Particularly, the signal reception quality of the wireless electronic device may be dependent upon the efficiency of the one or more radio frequency (RF) filters that may be included as part of the transceiver.

Generally, the RF filters of the transceivers may pass desirable frequencies and reject undesirable frequencies. As it may be appreciated, the number of RF filters that may be used to increase signal reception quality may increase as the number of frequency bands in which the wireless electronic devices support increases. Indeed, in some instances, the wireless electronic devices may be required to support multiple wireless applications (e.g., Bluetooth, Wi-Fi) each operating within the same frequency band. For example, certain home entertainment systems may be required to support a number of simultaneous Bluetooth profiles, and at the same time achieve increased Wi-Fi data throughput. However, as Bluetooth and Wi-Fi applications may, in many instances, operate on the same 2.4 gigahertz (GHz) industrial, scientific, and medical (ISM) frequency band, concurrently supporting Bluetooth and Wi-Fi applications may markedly degrade the data signals due to, for example, RF blocking and out-of-band (OOB) noise. It may be useful to provide more robust filtering techniques to support wireless applications operating within the same frequency band.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Various embodiments of the present disclosure may be useful in concurrently receiving and transmitting Wi-Fi signals and Bluetooth signals in the same frequency band. By way of example, an electronic device includes a transceiver configured to transmit data and to receive data over channels of a first wireless network and a second wireless network concurrently. The transceiver includes a plurality of filters configured to allow the transceiver to transmit the data and to receive the data in the same frequency band by reducing interference between signals of the first wireless network and the second wireless network.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
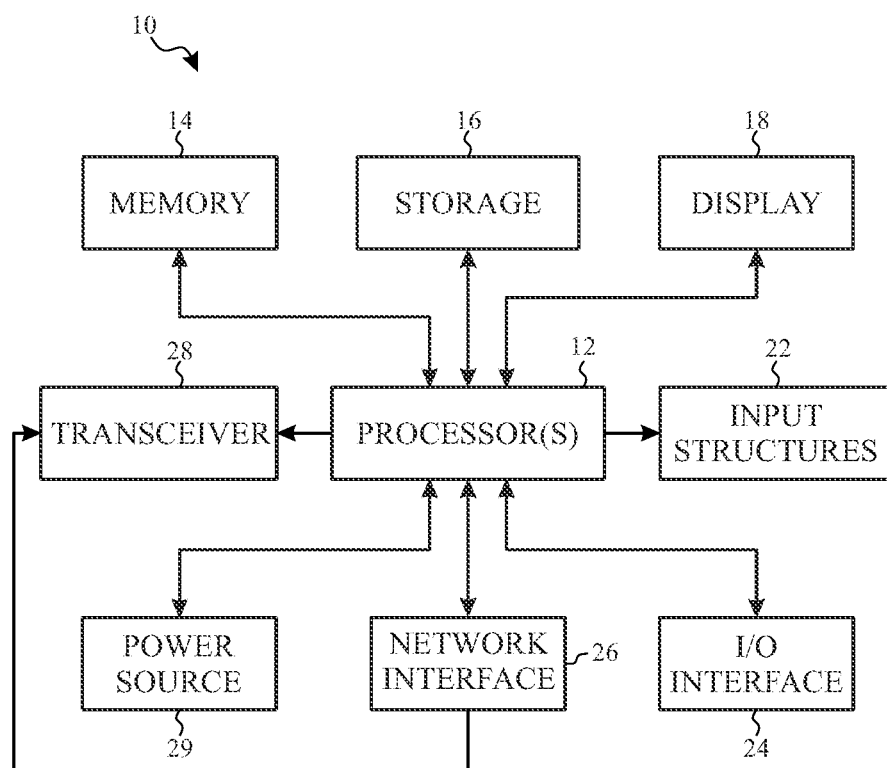
FIG. 1 is a schematic block diagram of an electronic device including a transceiver, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Embodiments of the present disclosure generally relate to a transceiver and RF front-end circuitry of an electronic device that may be used to support a number of concurrent Bluetooth and Wi-Fi wireless applications that may operate in the same 2.4 GHz frequency band. In certain embodiments, the RF front-end circuitry may include, for example, a number of film bulk acoustic resonator (FBAR) filter RF filters (e.g., 13-channel FBAR filters) as part of the RF front-end circuitry that may allow the electronic device to concurrently receive and transmit Wi-Fi signals and Bluetooth signals in the same 2.4 GHz frequency band by increasing the number of potentially non-overlapping frequency channels and allowing the RF filters (e.g., FBAR RF filters) to switch between potentially non-overlapping frequency channels when receiving and transmitting Wi-Fi signals and Bluetooth signals in the same 2.4 GHz frequency band.

Specifically, the FBAR RF filters (e.g., 13-channel FBAR RF filters), for example, may be designed and configured such that channels on which 2.4 GHz Bluetooth signals are received and/or transmitted may provide excellent OOB frequency rejection of 2.4 GHz Wi-Fi signals occupying the same or a similar frequency spaces as 2.4 GHz Bluetooth signals, and vice-versa. In this way, the transceiver, and, by extension, the electronic device may be allowed to concurrently receive and transmit Wi-Fi signals and Bluetooth signals in the same 2.4 GHz frequency band without utilizing time division duplexing (TDD), which may in some instances degrade the Wi-Fi data throughput and reduce the available airtime for Wi-Fi data transmission and reception. In another embodiment, the transceiver of the electronic device may include a dedicated Bluetooth antenna, and the RF front-end circuitry may include dedicated additional Bluetooth circuitry. In certain embodiments, the dedicated Bluetooth circuitry may be used to allow the transceiver and the electronic device to support, for example, up to two times the number of Bluetooth profiles and/or peripheral devices as compared to a transceiver and electronic not including the dedicated Bluetooth circuitry.

Still, in another embodiment, the RF front-end circuitry may not include the number of RF filters, and instead may utilize the additional dedicated Bluetooth circuitry to perform a coordinated multi time division duplexing (multi-TDD) (e.g., which may reduce circuitry area cost) to concurrently receive and transmit Wi-Fi signals and Bluetooth signals in the same 2.4 GHz frequency band.

With the foregoing in mind, a general description of suitable electronic devices that may employ a transceiver and RF front-end circuitry useful in concurrently supporting Wi-Fi signals and Bluetooth applications operating in the same frequency band will be provided below. Turning first to FIG. 1, an electronic device 10 according to an embodiment of the present disclosure may include, among other things, one or more processor(s) 12, memory 14, nonvolatile storage 16, a display 18 input structures 22, an input/output (I/O) interface 24, network interfaces 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
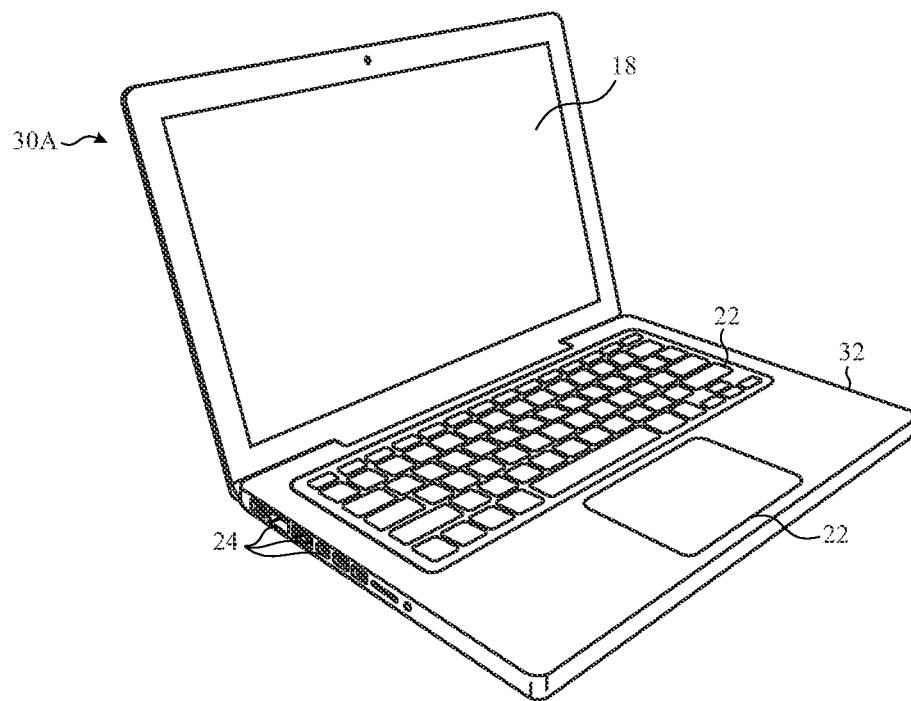
FIG. 2 is a perspective view of a notebook computer representing an embodiment of the electronic device of FIG. 1.
Figure 3:
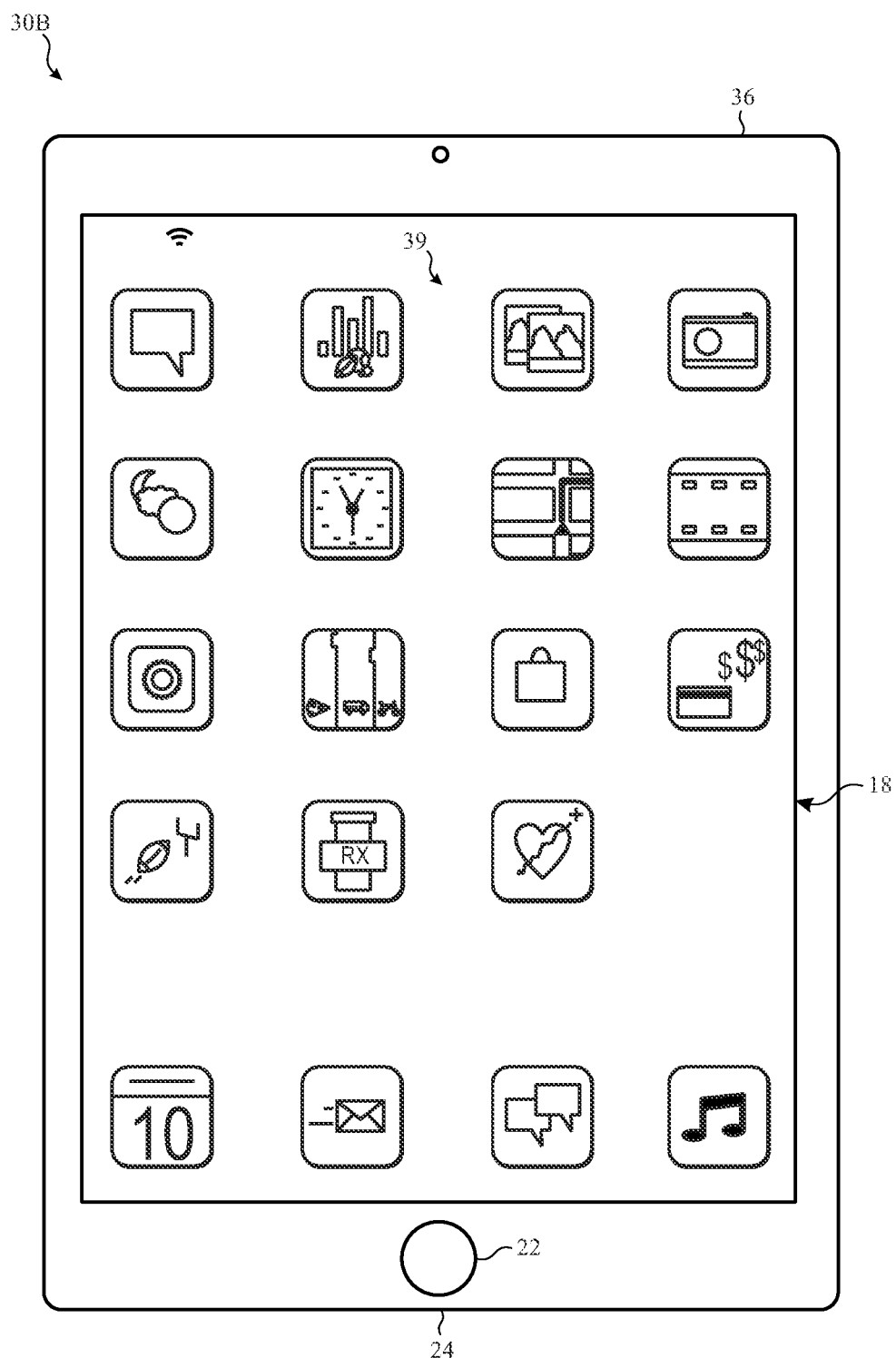
FIG. 3 is a front view of a hand-held device representing another embodiment of the electronic device of FIG. 1.
Figure 4:
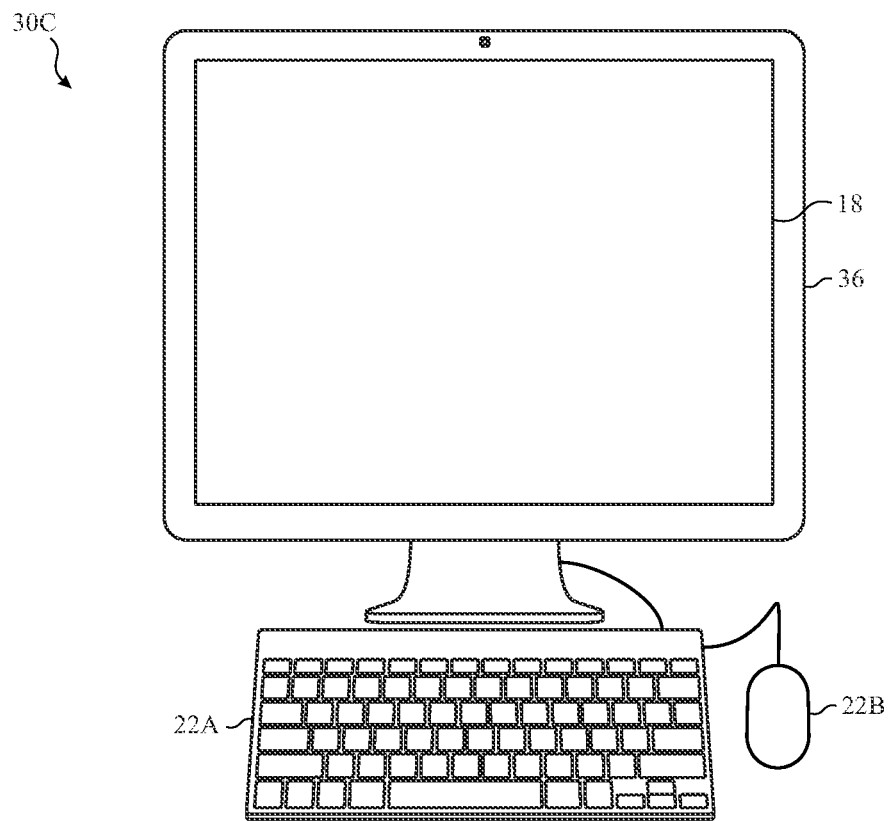
FIG. 4 is a front view of a desktop computer representing another embodiment of the electronic device of FIG. 1.
Figure 5:
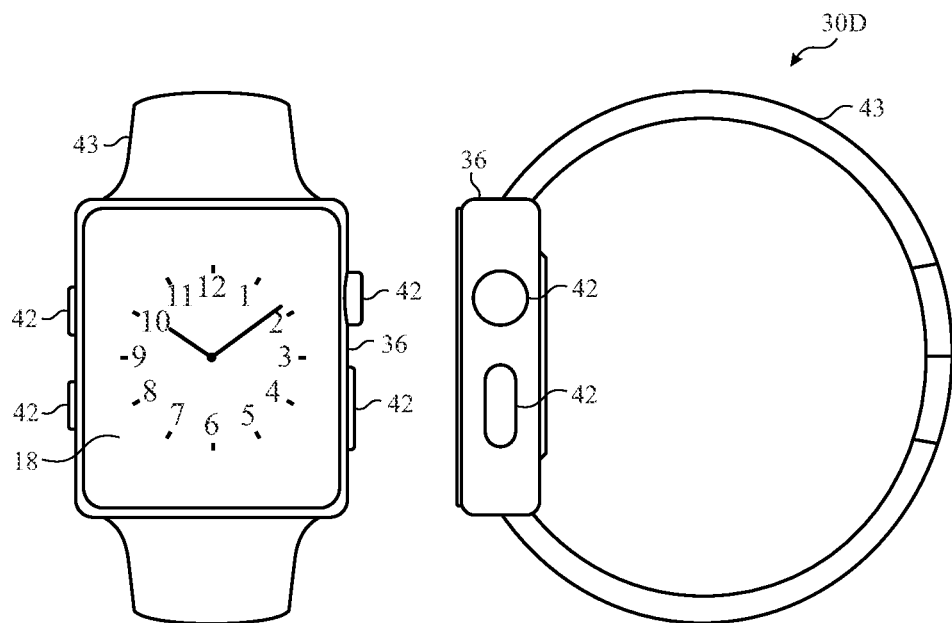
FIG. 5 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the desktop computer depicted in FIG. 4, the wearable electronic device depicted in FIG. 5, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile memory 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the non-volatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, or long term evolution (LTE) cellular network. The network interface 26 may also include interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry the may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. For example, as noted above, the transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE cellular networks), WiMAX networks, mobile WiMAX networks, ADSL and VDSL networks, DVB-T and DVB-H networks, UWB networks, and so forth. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 22, and ports of an I/O interface 24. In one embodiment, the input structures 22 (such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 30B may represent, for example, a portable phone, a media player, a personal data organizer, a handheld game platform, or any combination of such devices. By way of example, the handheld device 30B may be a tablet-sized embodiment of the electronic device 10, which may be, for example, a model of an iPad® available from Apple Inc. of Cupertino, California.

The handheld device 30B may include an enclosure 36 to protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a standard connector and protocol, such as the Lightning connector provided by Apple Inc., a universal serial bus (USB), or other similar connector and protocol.

User input structures 22, in combination with the display 18, may allow a user to control the handheld device 30B. For example, the input structures 22 may activate or deactivate the handheld device 30B, the input structures 22 may navigate user interface to a home screen, a user-configurable application screen, and/or activate a voice-recognition feature of the handheld device 30B, the input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

Turning to FIG. 4, a computer 30C may represent another embodiment of the electronic device 10 of FIG. 1. The computer 30C may be any computer, such as a desktop computer, a server, or a notebook computer, but may also be a standalone media player or video gaming machine. By way of example, the computer 30C may be an iMac®, a MacBook®, or other similar device by Apple Inc. It should be noted that the computer 30C may also represent a personal computer (PC) by another manufacturer. A similar enclosure 36 may be provided to protect and enclose internal components of the computer 30C such as the dual-layer display 18. In certain embodiments, a user of the computer 30C may interact with the computer 30C using various peripheral input devices, such as the keyboard 22A or mouse 22B, which may connect to the computer 30C via a wired and/or wireless I/O interface.

Similarly, FIG. 5 depicts a wearable electronic device 30D representing another embodiment of the electronic device 10 of FIG. 1 that may be configured to operate using the techniques described herein. By way of example, the wearable electronic device 30D, which may include input structures 42 and a wristband 43, may be an Apple Watch® by Apple Inc. However, in other embodiments, the wearable electronic device 30D may include any wearable electronic device such as, for example, a wearable exercise monitoring device (e.g., pedometer, accelerometer, heart rate monitor), or other device by another manufacturer. The display 18 of the wearable electronic device 30D may include a touch screen (e.g., LCD, OLED display, active-matrix organic light emitting diode (AMOLED) display, and so forth), which may allow users to interact with a user interface of the wearable electronic device 30D. In addition, the input structures 42, which may correspond to the input structure 22 described above, may allow the users to interact with the user interface of the wearable electronic device 30D, as well.

Although not illustrated, it should be appreciated that, in other embodiments, the electronic device 10 may also include a digital media player and entertainment console that may be used to receive digital video data from any number of sources and stream the digital video data via a television (TV). For example, in one or more embodiments, the electronic device 10 may be an Apple TV® console available from Apple Inc.

In certain embodiments, as previously noted above, each embodiment (e.g., notebook computer 30A, handheld device 30B, computer 30C, and wearable electronic device 30D) of the electronic device 10 may include a transceiver 28, which may include RF front-end circuitry including a number of RF filters that may be used to support a number of concurrent Bluetooth and Wi-Fi wireless applications.

Figure 6:
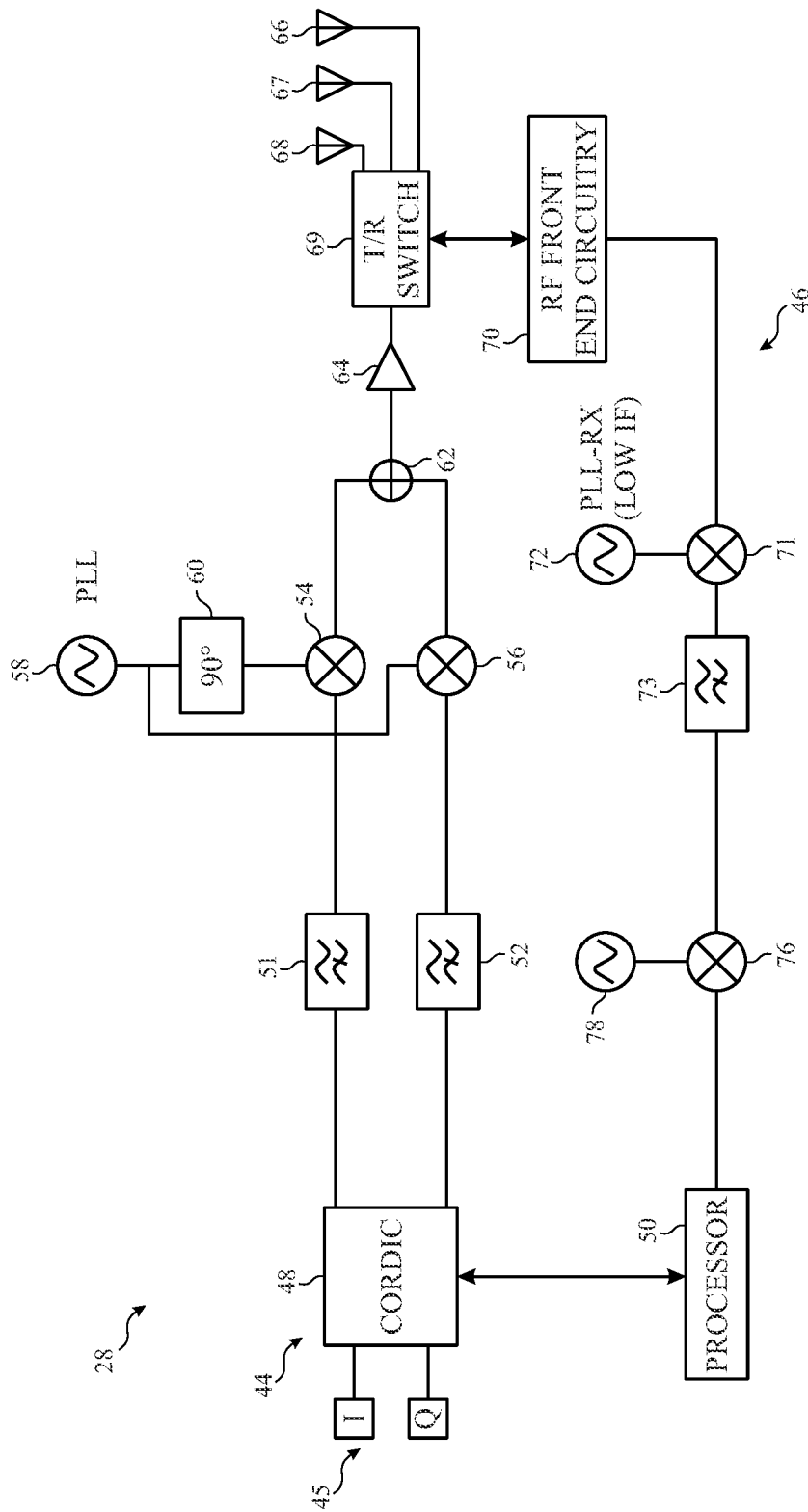
FIG. 6 is a schematic diagram of the transceiver included within the electronic device of FIG. 1, in accordance with an embodiment.

With the foregoing in mind, FIG. 6 depicts a schematic diagram of the transceiver 28. As illustrated, the transceiver 28 may include a transmitter 44 (e.g., transmitter path) and a receiver 46 (e.g., receiver path) coupled as part of a single unit. As depicted, the transmitter 44 may receive a signal 45 that may be initially modulated via a coordinate rotation digital computer (CORDIC) 48 that may, in some embodiments, be used to process individual Cartesian represented data symbols (e.g., OFDM symbols) into polar amplitude and phase components. In some embodiments, the CORDIC 48 may include a digital signal processor (DSP) or other processor architecture that may be used to process the incoming signal 45. In some embodiments, the CORDIC 48 may also communicate with a processor 50 (e.g., on-board processor) that may be used to process transmitted and/or received WLAN (e.g., Wi-Fi), cellular (e.g., LTE) signals, and/or a number of short-range communication signals (e.g., Bluetooth) signals.

In certain embodiments, during operation, the transmitter 44 may receive a Cartesian coordinate represented signal 45, which may include, for example, data symbols encoded according to orthogonal I/Q vectors. Thus, when an I/Q signal is converted into an electromagnetic wave (e.g., radio frequency (RF) signal, microwave signal, millimeter wave signal), the conversion is generally linear as the I/Q may be frequency band-limited. The I/Q signals 45 may be then respectively passed to high pass filters (HPFs) 51 and 52, which may be provided to pass the high frequency components of the I/Q signals 45 and filter out the low frequency components. As further illustrated, the I/Q signals 45 may be then respectively passed to mixers 54 and 56, which may be used to mix (e.g., multiply or upconvert) the in-phase (I) component and the quadrature (Q) component of the I/Q signals 45.

In certain embodiments, as further illustrated in FIG. 6, a transmitter phase lock loop (PLL-TX) or oscillator 58 may be provided to generate 90° out of phase oscillation signals by which to mix the orthogonal in-phase (I) component and the quadrature (Q) component to generate a carrier frequency and/or radio frequency (RF) signal. The in-phase (I) component and the quadrature (Q) component signals may be then recombined via a summer 62, and then passed to a power amplifier (PA) 64 to amplify the summed signal, and to generate an electromagnetic signal (e.g., RF signal, microwave signal, millimeter wave signal) to be provided to antennas 66, 67, and 68 (e.g., multiple input multiple output [MIMO] antennas) for transmission. In some embodiments, the antennas 66, 67, and 68 may be included on the same integrated chip as the transceiver 28 architecture. However, in other embodiments, the antennas 66, 67, and 68 may be fabricated as part of a separate chip and/or circuitry that may be coupled to the other circuitry components (e.g., amplifier 64) of the transceiver 28.

In certain embodiments, as previously noted, the transmitter 44 may be coupled together with the receiver 46. Thus, as illustrated, the transceiver 28 may further include a transmitter/receiver (T/R) switch 69 or other circulator device, which may be useful in routing signals to be transmitted from the transmitter 44 (e.g., transmitter path) to the antennas 66, 67, and 68 and routing signals received via the antennas 66, 67, and 68 to the receiver 46 (e.g., receiver path). In certain embodiments, the processor 50 in conjunction with an RF front-end circuitry 70 of the transceiver 28 may be used, for example, to support a number of concurrent Bluetooth and Wi-Fi wireless applications. Indeed, in certain embodiments, as will be further appreciated with respected to FIGS. 7-10, the RF front-end circuitry 70 including, for example, a number of RF filters may be used to support a number of concurrent Bluetooth and Wi-Fi wireless applications that may operate in the same ISM 2.4 GHz frequency band.

As further depicted in FIG. 6, during operation, the receiver 46 may receive RF signals (e.g., LTE and/or Wi-Fi signals) detected by the antennas 66, 67, and 68. For example, as illustrated in FIG. 6, received signals may be received by the receiver 46. The received signals may be then passed to a mixer 71 (e.g., downconverter) to mix (e.g., multiply) the received signals with an IF signal (e.g., 10-20 megahertz (MHz) signal) provided by a receiver phase lock loop (PLL-RX) or oscillator 72.

In certain embodiments, as further illustrated in FIG. 6, the IF signal may be then passed to a low-pass filter 73, and then mixer 76 that may be used to mix (e.g., downconvert a second time) with a lower IF signal generated by an oscillator 78 (e.g., numerically controlled oscillator). The oscillator 78 may include any oscillator device that may be useful in generating an analog or discrete-time and/or frequency domain (e.g., digital domain) representation of a carrier frequency signal. The IF signal may be then passed to the processor 50 to be processed and analyzed.

Figure 7:
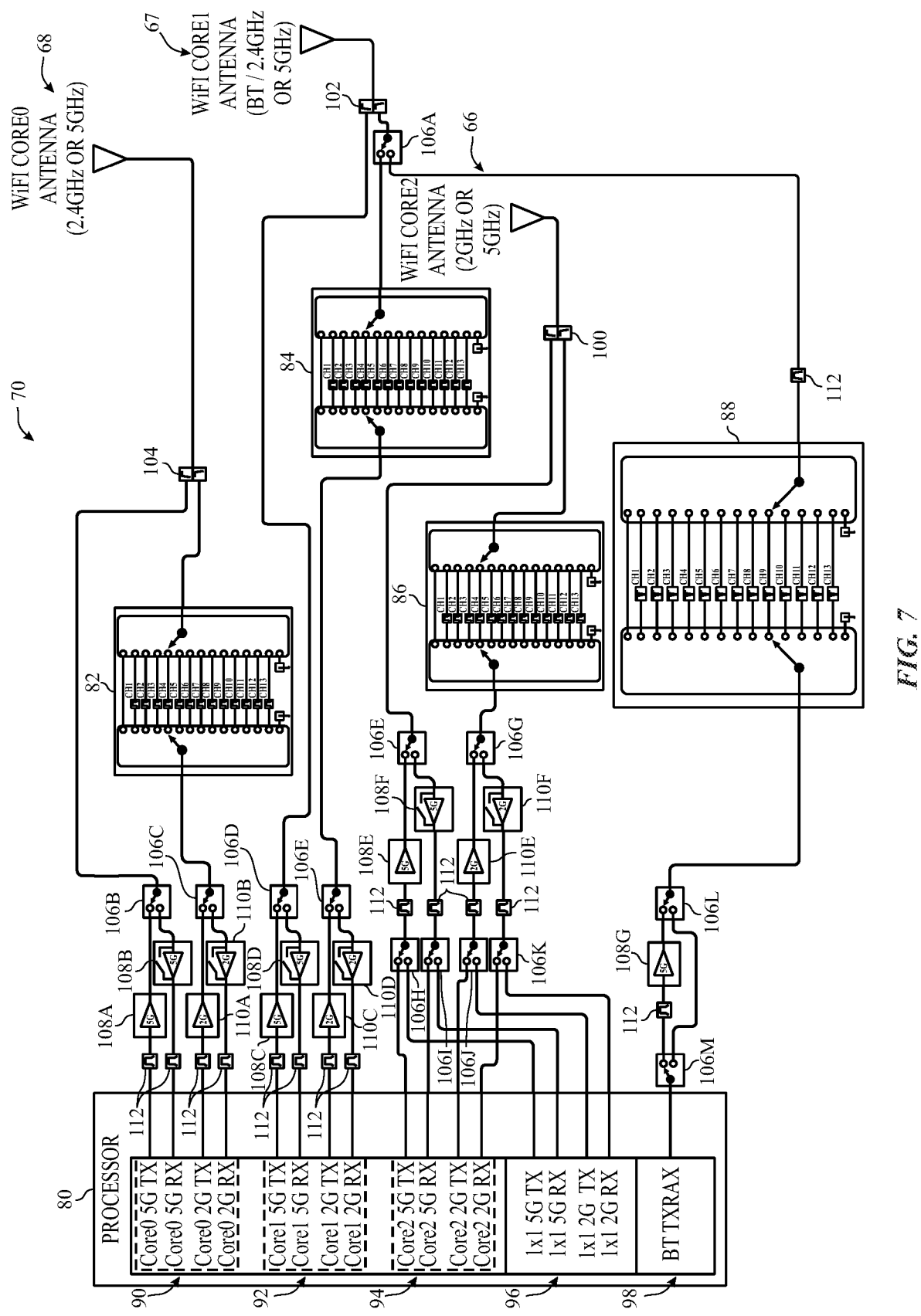
FIG. 7 is a schematic diagram of radio frequency (RF) front-end circuitry including a number of filters included within the transceiver of FIG. 6, in accordance with an embodiment.

Turning now to FIG. 7, a detailed illustration of the RF front-end circuitry 70 is depicted. As depicted, the RF front-end circuitry 70 may include a processor 80 electrically coupled to a number of RF filters 82, 84, 86, and 88. In some embodiments, the processor 80 may include a baseband processor (BBP) or any of various devices that may be used to manage the radio processing and functions (e.g., Bluetooth and Wi-Fi signals received from, and provided to the antennas 66, 67, and 68) of the transceiver 28. In some embodiments, the processor 80 may include a number of cores (e.g., 2.4 GHz and 5 GHz frequency band cores) 90 (e.g., "Core0"), 92 (e.g., "Core1"), 94 (e.g., "Core2"), and 96 (e.g., "1×1") for receiving and transmitting signal inputs and outputs from and to the RF filters 82, 84, and 86. As further depicted, the processor 80 may include a Bluetooth peripheral core 98 (e.g., "BT TXRAX") for receiving and transmitting signal inputs and outputs from and to the RF filter 88 and to one or more peripheral Bluetooth devices that may be communicatively coupled to the electronic device 10 via the transceiver 28. As illustrated, the RF filter 88 may, in one embodiment, be coupled to the antenna 67. However, in other embodiments, the RF filter 88 may instead be coupled to the antenna 68 or to the antenna 66.

In certain embodiments, the RF filters 82, 84, 86, and 88 may include any of various devices that may be useful in allowing desired frequencies to pass, for example, from the antennas 66, 67, and 68 to the processor 80, and disallowing undesired frequencies from passing from the antennas 66, 67, and 68 to the processor 80. For example, in certain embodiments, the RF filters 82, 84, 86, and 88 may each include a film bulk acoustic resonator (FBAR) filter (e.g., free-standing membrane filter) that may be particularly useful for performing frequency band selection and coexistence (e.g., concurrent operation) between, for example, Bluetooth and Wi-Fi applications. While the present techniques may be primarily discussed with respect to FBAR filter embodiments of the RF filters 82, 84, 86, and 88, it should be appreciated that, in other embodiments, the RF filters 82, 84, 86, and 88 may include, for example, solidly mounted resonator (SMR) filters, surface acoustic wave (SAW) filters, bulk acoustic wave (BAW), or any of various other RF filter technologies that may be efficient in supporting concurrent Bluetooth and Wi-Fi applications.

Specifically, in certain embodiments, while receiving, the RF filters 82, 84, 86, and 88 may be used to detect signals within a specified frequency band or channel while reducing and/or substantially eliminating interference from frequencies outside of the specified frequency band (e.g., RF blocking). While transmitting, the RF filters 82, 84, 86, and 88 may be used to transmit signals within a specified frequency band or channel while reducing and/or substantially eliminating out-of-band (OOB) (e.g., difference between the minimal signal level of the pass frequency band and the maximum signal level in the rejection frequency band) emissions before transmitting the signals via the antennas 66, 67, and 68. Indeed, by including the RF filters 82, 84, 86, and 88 (e.g., FBAR RF filters) as part of the RF front-end circuitry 70, the transceiver 28 may be allowed to concurrently receive and transmit Wi-Fi signals and Bluetooth signals in the same 2.4 GHz frequency band without utilizing time division duplexing (TDD), which may in some instances degrade the Wi-Fi data throughput and reduce the available airtime for Wi-Fi data transmission and reception.

For example, in certain embodiments, the antennas 66, 67, and 68 may transmit and receive Wi-Fi signals from and to, for example, a Wi-Fi router or other Wi-Fi "hotspot" in which the electronic device 10 may be communicatively coupled to via the transceiver 28 and the antennas 66, 67, and 68. At substantially the same time, the antennas 66, 67, and 68 may also transmit and/or receive Bluetooth signals to and from, for example, any number of various Bluetooth peripheral devices such as, for example, video game consoles and/or controllers, wireless speakers, wireless headphones, automobiles, drone devices, and/or or other electronic devices that may be part of an in-home network (e.g., mesh networking) and operating in the substantially the same frequency band (e.g., 2.4 GHz frequency band).

In some embodiments, the RF filters 82, 84, and 86 may be used primarily to filter transmitted and received Wi-Fi signals, while the RF filter 88 may be used primarily to filter transmitted and received Bluetooth signals. As illustrated, in the present embodiment, the RF filter 88 and the RF filter 84 may be each coupled to the antenna 67, and may be isolated via a T/R switch 106A. For example, during operation, Wi-Fi and/or Bluetooth signals detected upon the antennas 66, 67, and 68 or to be transmitted via the antennas 66, 67, and 68 may be passed through low-pass/high-pass filters 100, 102, and 104 to filter out undesirable frequency harmonics.

As depicted, the RF filters may, in some embodiments, include, for example, up to 13 separate frequency channels on which Wi-Fi and/or Bluetooth signals may be transmitted and/or received. As previously discussed, received Wi-Fi and/or Bluetooth signals may be passed by the RF filters 82, 84, 86, and 88 in a specific frequency band while reducing interference from other frequency bands (e.g. RF blocking), and the RF filters 82, 84, 86, and 88 may reduce OOB frequency emissions before transmitting the Wi-Fi and/or Bluetooth signals. For example, in certain embodiments, the Bluetooth and Wi-Fi signals may collectively occupy a portion of the available 2.4 GHz frequency band that may include an 83 MHz bandwidth.

In certain embodiments, the Bluetooth signals may be allowed to "hop" (e.g., heuristically switch) between 79 different 1 MHz bandwidth channels in the available 2.4 GHz frequency band. On the other hand, the Wi-Fi signals may be centered on a single channel that may include a 22 MHz bandwidth. Indeed, when the Bluetooth signals and Wi-Fi signals are operating along the same or a very proximate frequency channel, the single 22 MHz bandwidth on which the Wi-Fi signals occupy may overlap, for example, the same frequency as 22 channels of the 1 MHz bandwidth 79 Bluetooth frequency channels. Thus, in certain embodiments, by providing the 13-channel RF filters 82, 84, 86, and 88 (e.g., FBAR RF filters) as part of the RF front-end circuitry 70, the transceiver 28 may be allowed to concurrently receive and transmit Wi-Fi signals and Bluetooth signals in the same 2.4 GHz frequency band by increasing the number of potentially non-overlapping frequency channels and allowing the RF filters 82, 84, 86, and 88 (e.g., FBAR RF filters) to switch between potentially non-overlapping frequency channels when receiving and transmitting Bluetooth signals and Wi-Fi signals in the same 2.4 GHz frequency band.

For example, in certain embodiments, the RF filters 82, 84, and 86 (e.g., FBAR RF filters) may allow the transceiver 28 to receive and/or transmit Wi-Fi signals via channel 1 (e.g., "CH 1") of the respective RF filters 82, 84, and 86 (e.g., FBAR RF filters). In such a case, channel 1 (e.g., "CH 1") of the respective RF filters 82, 84, and 86 may include, for example, a 22 MHz bandwidth. Particularly, while receiving Wi-Fi signals in the 2.4 GHz frequency band, the antennas 66, 67, and 68 may respectively pass 2.4 GHz Wi-Fi signals to low-pass/high-pass filters 100, 102, and 104 and over a 22 MHz-wide frequency channel (e.g., channel "CH 1") of the respective RF filters 82, 84, and 86. The 2.4 GHz Wi-Fi signals may be then passed from the respective RF filters 82, 84, and 86 through respective T/R switches 106C, 106E, and 106G, through respective low noise amplifiers (LNAs) 110B, 110D, 110F, through bandpass filters 112, and finally to the respective cores 90, 92, and 94 of the processor 80.

Similarly, while transmitting Wi-Fi signals in the 2.4 GHz frequency band, the respective cores 90, 92, and 94 of the processor 80 may respectively pass 2.4 GHz Wi-Fi signals to bandpass filters 112 through respective LNAs 110A, 110C, and 110E and over the same 22 MHz-wide frequency channel (e.g., channel "CH 1") of the respective RF filters 82, 84, and 86. The 2.4 GHz Wi-Fi signals may be then transmitted via the antennas 66, 67, and 68.

In certain embodiments, the RF filters 82, 84, and 86 (e.g., FBAR RF filters) may allow the transceiver 28 to receive and/or transmit 2.4 GHz Bluetooth signals via other available channels (e.g., "CH 2-CH13") of the respective RF filters 82, 84, and 86 (e.g., FBAR RF filters). For example, in some embodiments, the RF filters 82, 84, and 86 (e.g., FBAR RF filters) may allow 2.4 GHz Bluetooth signals to pass through, for example, channel 3 (e.g., "CH 3"), channel 8 (e.g., "CH 8"), and channel 13 (e.g., "CH 13"), or, for example, on channel 2 (e.g., "CH 2"), channel 7 (e.g., "CH 7") and channel 12 (e.g., "CH 12"). Similarly, the RF filter 88 (e.g., FBAR RF filter) may be dedicated to only Bluetooth signals, and may thus allow the transceiver 28 to receive and/or transmit 2.4 GHz Bluetooth signals via any of the available channels (e.g., "CH 1-CH13") of the RF filter 88. As further depicted in FIG. 7, received 2.4 GHz Bluetooth signals may be passed from the RF filter 88 through T/R switches 106L and 106M to the Bluetooth peripheral core 98 (e.g., "BT TXRAX") of the processor 80. Likewise, the transmission path from the Bluetooth peripheral core 98 (e.g., "BT TXRAX") to the RF filter 88 may include a path through a bandpass filter 112 and an LNA 108G (e.g., 5 GHz LNA) to the RF filter 88.

As previously discussed, by providing the 13-channel RF filters 82, 84, 86, and 88 (e.g., FBAR RF filters) as part of the RF front-end circuitry 70, the transceiver 28 may be allowed to concurrently receive and transmit Wi-Fi signals and Bluetooth signals in the same 2.4 GHz frequency band by increasing the number of potentially non-overlapping frequency channels and allowing the RF filters 82, 84, 86, and 88 to switch between potentially non-overlapping frequency channels received and transmitted Wi-Fi signals and Bluetooth signals in the same 2.4 GHz frequency band. Specifically, the 13-channel RF filters 82, 84, 86, and 88 (e.g., FBAR RF filters) of the RF front-end circuitry 70 may be designed and configured such that channels on which 2.4 GHz Bluetooth signals are received and/or transmitted may provide excellent OOB frequency rejection of 2.4 GHz Wi-Fi signals occupying the same or a similar frequency spaces as 2.4 GHz Bluetooth signals, and vice-versa. In this way, the transceiver 28 may be allowed to concurrently receive and transmit Wi-Fi signals and Bluetooth signals in the same 2.4 GHz frequency band without utilizing TDD, which may in some instances degrade Wi-Fi data throughput and reduce the available airtime for Wi-Fi data transmission and reception.

Figure 8:
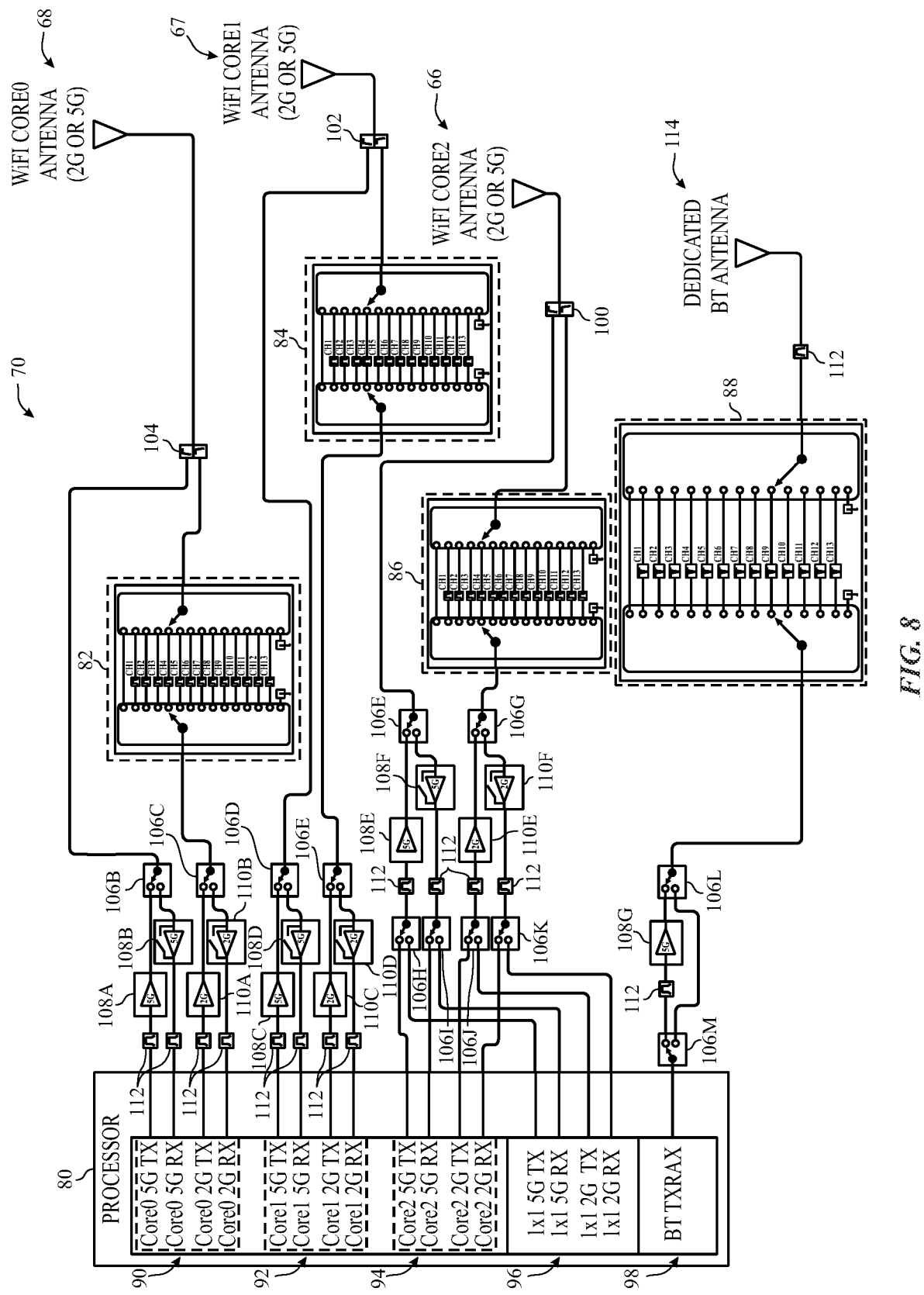
FIG. 8 is a schematic diagram of the RF front-end circuitry of FIG. 7 including the number of filters and a dedicated Bluetooth antenna, in accordance with an embodiment.

Turning now to FIG. 8, which illustrates an embodiment of the RF front-end circuitry 70 including not only the dedicated RF filter 88 (e.g., FBAR filter), but also a dedicated Bluetooth antenna 114. Particularly, the dedicated Bluetooth antenna 114 may include an additional MIMO antenna (e.g., in addition to the MIMO antennas 66, 67, and 68) that may be used to receive and/or transmit Bluetooth signals, exclusively. For example, the dedicated Bluetooth antenna 114 may be used to communicatively couple the electronic device 10 to, for example, Bluetooth peripheral devices such as, for example, video game consoles and/or controllers, wireless speakers, wireless headphones, automobiles, drone devices, and/or or other electronic devices that may be part of an in-home network. That is, in the present embodiment, the dedicated Bluetooth antenna 114 may support specific Bluetooth profiles and applications, while the antennas 66, 67, and 68 may be used to support Wi-Fi applications. Specifically, by providing the additional dedicated Bluetooth antenna 114, increased isolation may be achieved between the received and/or transmitted Bluetooth and Wi-Fi signals and thereby further supporting the concurrent reception and transmission of Wi-Fi signals and Bluetooth signals in the same 2.4 GHz frequency band.

Figure 9:
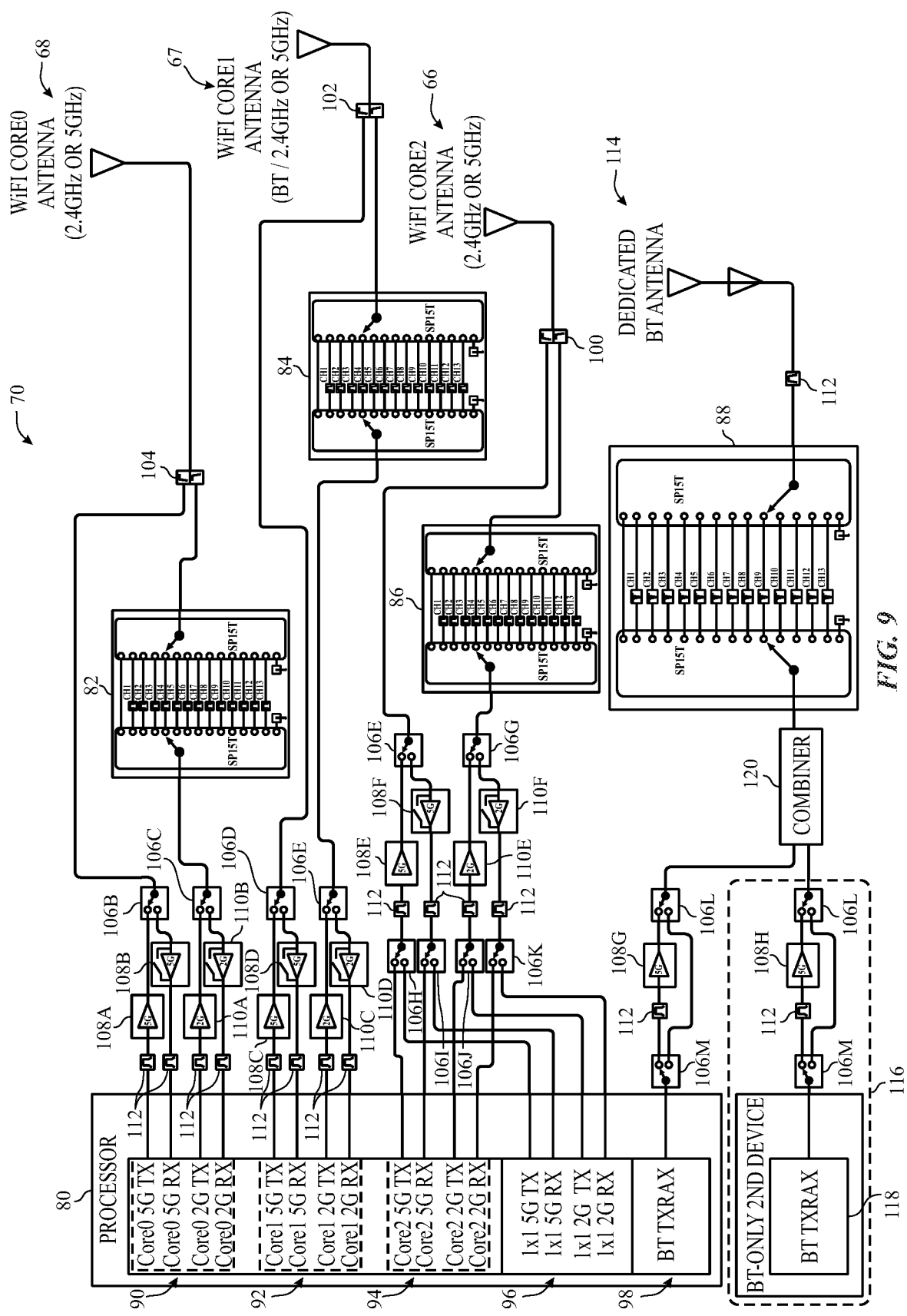
FIG. 9 is a schematic diagram of the RF front-end circuitry of FIG. 7 including the number of filters, the dedicated Bluetooth antenna, and dedicated Bluetooth peripheral circuitry, in accordance with an embodiment.

FIG. 9 illustrates an embodiment of the RF front-end circuitry 70 including the dedicated RF filter 88 (e.g., FBAR filter), the dedicated Bluetooth antenna 114, and additional dedicated Bluetooth circuitry 116. In certain embodiments, the additional dedicated Bluetooth circuitry 116, which may include a Bluetooth specific device 118 (e.g., processor core), may be used to allow the transceiver 28, and, by extension, the electronic device 10, to concurrently support, for example, up to 2 times the number of Bluetooth profiles and/or peripheral devices as compared to a transceiver 28 not including additional dedicated Bluetooth circuitry 116. For example, in some embodiments, by including the additional dedicated Bluetooth circuitry 116 as part of the RF front-end circuitry 70, the transceiver 28 may be able to concurrently support up to, for example, a total of 14 Bluetooth peripheral devices.

As illustrated, Bluetooth signals received and/or transmitted by the additional dedicated Bluetooth circuitry 116 may be combined or split via combiner circuitry 120 (e.g., electronic adder) with Bluetooth signals received and/or transmitted by the Bluetooth core 98 (e.g., "BT TXRAX") of the processor 80. In some embodiments, in addition to combining (e.g., adding) the respective outputs of the Bluetooth core 98 (e.g., "BT TXRAX") and the dedicated Bluetooth circuitry 116, the combiner circuitry 120 may be used to provide a separation in frequency (e.g., frequency isolation) between the Bluetooth core 98 (e.g., "BT TXRAX") and the Bluetooth specific device 118 (e.g., processor core) of the additional dedicated Bluetooth circuitry 116 to prevent interference between the various Bluetooth profile signals.

Figure 10:
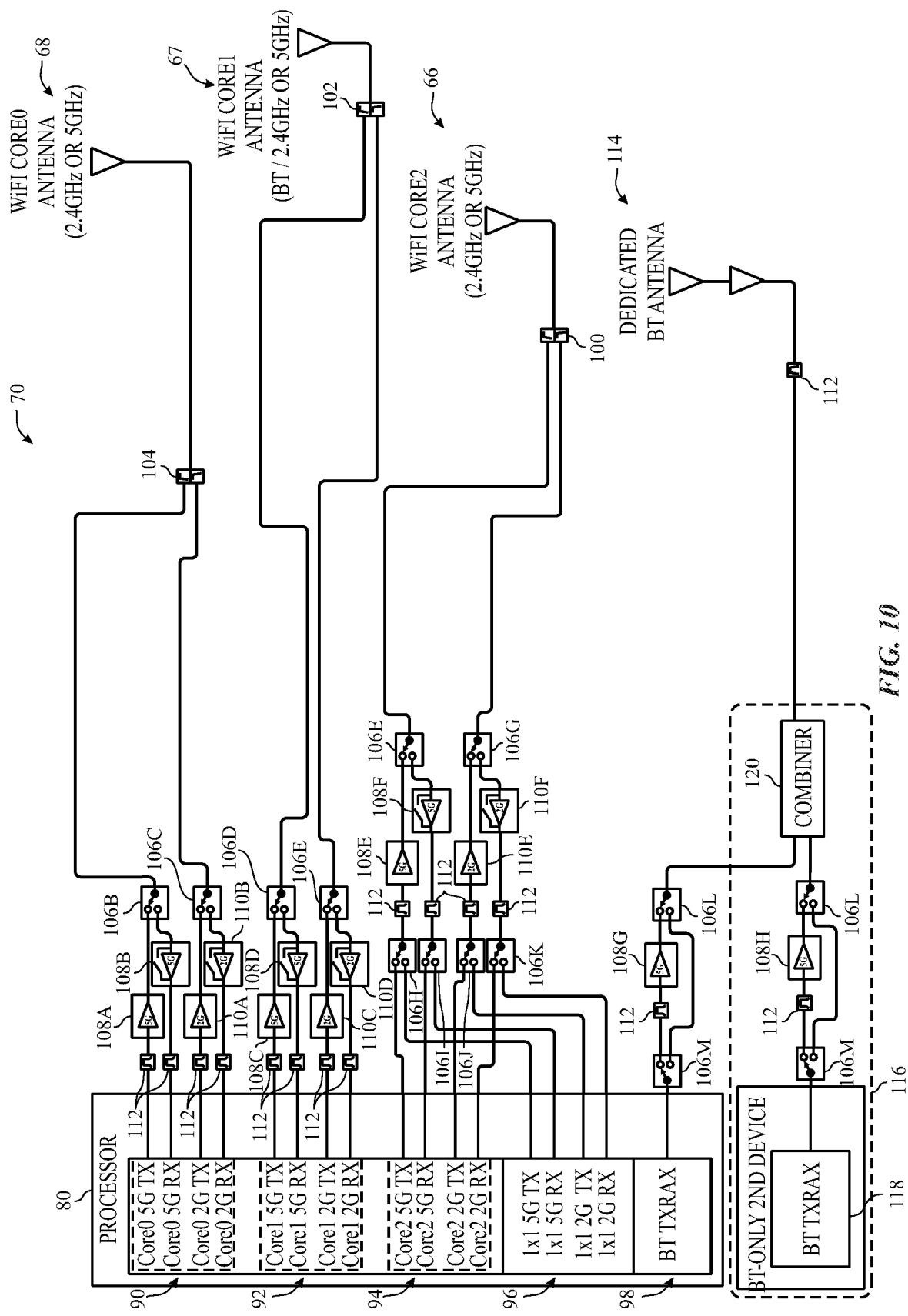
FIG. 10 is a schematic diagram of RF front-end circuitry including, a dedicated Bluetooth antenna and dedicated Bluetooth peripheral circuitry, in accordance with an embodiment.

In other embodiments, the additional dedicated Bluetooth circuitry 116 may facilitate the use of TDD to concurrently receive and transmit Wi-Fi signals and Bluetooth signals in the same 2.4 GHz frequency band. For example, FIG. 10 illustrates an embodiment of the RF front-end circuitry 70 that does not include the RF filters 82, 84, 86, and 88, and instead utilizes the additional dedicated Bluetooth circuitry 116 to concurrently receive and transmit Wi-Fi signals and Bluetooth signals in the same 2.4 GHz frequency band. Specifically, in the present embodiment, the additional Bluetooth circuitry 116 of the RF front-end circuitry 70 may allow the transceiver 28 to perform a coordinated multi time division duplexing (multi-TDD) without including the RF filters 82, 84, 86, and 88 (e.g., which may reduce circuitry area cost).

For example, in the present embodiment, the antennas 66, 67, and 68 may be reserved for receiving and transmitting Wi-Fi signals (e.g., separated into timeslots) while the dedicated Bluetooth antenna 114 may be reserved for receiving and transmitting Bluetooth signals. As discussed above with respect to FIG. 9, the additional dedicated Bluetooth circuitry 116 may allow the transceiver 28, and, by extension, the electronic device 10, to concurrently support, for example, up to 2 times the number of Bluetooth profiles and/or peripheral devices as compared to a transceiver 28 not including additional dedicated Bluetooth circuitry 116. In one embodiment, the Bluetooth core 98 (e.g., "BT TXRAX") and the dedicated Bluetooth circuitry 116 may share the same time slot (e.g., by allowing frequency hopping between the Bluetooth core 98 and the dedicated Bluetooth circuitry 116), while the received and/or transmitted Wi-Fi signals may be separated into different timeslots. In this way, the additional Bluetooth circuitry 116 may facilitate the use of TDD to concurrently receive and transmit Wi-Fi signals and Bluetooth signals in the same 2.4 GHz frequency band (e.g., without the added area cost of the RF filters 82, 84, 86, and 88).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
a transceiver comprising:
a first peripheral core configured to communicate a first signal over a first channel of a first wireless network;
a second peripheral core dedicated to communicating signals using a second wireless network, the second peripheral core configured to communicate a second signal over a second channel of the second wireless network, wherein the first channel and the second channel are within a frequency band, the first signal at least partially overlaps in time with the second signal, and the first wireless network is different from the second wireless network;
a first filter coupled to the first peripheral core, the first filter configured to filter the first signal; and
a second filter coupled to the second peripheral core, the second filter dedicated to the second wireless network and configured to filter the second signal;
a first antenna coupled to the first filter for communication associated with the first wireless network during transmission of the first signal; and
a second antenna coupled to the second filter and dedicated to communication associated with the second wireless network during transmission of the second signal.

2. The electronic device of claim 1, wherein the first wireless network is associated with an 802.11 protocol, and the second wireless network is associated with a Bluetooth protocol.

3. The electronic device of claim 1, wherein the first antenna comprises a multiple input multiple output (MIMO) antenna.

4. The electronic device of claim 1, wherein the first filter is configured to reduce interference between the first signal and the second signal.

5. The electronic device of claim 1, wherein the first channel does not overlap with the second channel within the frequency band.

6. The electronic device of claim 1, wherein a bandwidth of the first channel is larger than a bandwidth of the second channel.

7. The electronic device of claim 1, wherein the frequency band comprises a 2.4 gigahertz (GHz) radio band.

8. A transceiver comprising:
a first peripheral core configured to communicate a first signal over a first channel of a first wireless network;
a second peripheral core dedicated to communicating signals using a second wireless network, the second peripheral core configured to communicate a second signal over a second channel of the second wireless network, wherein the first channel and the second channel are within a frequency band, the first signal at least partially overlaps in time with the second signal, and the first wireless network is different from the second wireless network;
a first filter coupled to the first peripheral core and a first antenna associated with the first wireless network to receive the first signal; and
a second filter coupled to the second peripheral core and a second antenna associated with the second wireless network to receive the second signal, the second filter dedicated to the second wireless network.

9. The transceiver of claim 8, wherein the first filter is configured to reduce interference between the first signal and the second signal.

10. The transceiver of claim 8, wherein the first antenna is configured to transmit the first signal and the second antenna is configured to communicate the second signal.

11. The transceiver of claim 8, wherein the first wireless network is associated with an 802.11 protocol.

12. The transceiver of claim 11, wherein the second wireless network is associated with a Bluetooth protocol.

13. The transceiver of claim 8, wherein the first signal and the second signal are communicated in the frequency band during respective timeslots according to a multi-time division duplexing (multi-TDD) technique.

14. The transceiver of claim 8, comprising at least one processor configured to generate, substantially simultaneously, the first signal and the second signal in accordance with a multi-time division duplexing (multi-TDD) technique.

15. A method, comprising:
receiving, by a first antenna of an electronic device associated with a first wireless network, a first signal over a first channel of the first wireless network;
filtering, by a first filter coupled to the first antenna and disposed within a transceiver of the electronic device, the first signal;
receiving, by a first peripheral core of the transceiver, the first signal as filtered by the first filter;
receiving, by a second antenna of the electronic device associated with a second wireless network, a second signal over a second channel of the second wireless network, wherein the first channel and the second channel are within a frequency band, the first wireless network is different from the second wireless network, and the second signal is received at least partially concurrently with the first signal;

filtering, by a second filter coupled to the second antenna and disposed within the transceiver, the second signal, wherein the second filter is dedicated to the second wireless network; and receiving, by a second peripheral core of the transceiver, the second signal as filtered by the second filter, wherein the second peripheral core receives the second signal at least partially concurrently with the first peripheral core receiving the first signal.

16. The method of claim 15, wherein the first filter is configured to filter a first set of interference properties with respect to the second signal.

17. The method of claim 16, wherein the second filter is configured to filter a second set of interference properties with respect to the first signal.

18. The method of claim 15, comprising receiving the first signal and receiving the second signal in accordance with a multi-time division duplexing (multi-TDD) technique.

19. The method of claim 15, wherein the first wireless network is associated with an 802.11 protocol, and wherein the second wireless network is associated with a Bluetooth protocol.

20. The method of claim 15, wherein the first filter comprises a film bulk acoustic resonator (FBAR) filter.

* * * * *